(12) United States Patent
Wang et al.

(10) Patent No.: US 9,291,507 B1
(45) Date of Patent: Mar. 22, 2016

(54) DIFFERENTIAL CAPACITIVE READOUT SYSTEM AND METHOD FOR INFRARED IMAGING

(71) Applicants: Weidong Wang, Oldsmar, FL (US); John Bumgarner, Anniston, AL (US)

(72) Inventors: Weidong Wang, Oldsmar, FL (US); John Bumgarner, Anniston, AL (US)

(73) Assignee: University of South Florida, Tampa, FL (US)

( * ) Notice: Subject to any disclaimer, the term of this patent is extended or adjusted under 35 U.S.C. 154(b) by 81 days.

(21) Appl. No.: 14/231,052

(22) Filed: Mar. 31, 2014

Related U.S. Application Data

(63) Continuation-in-part of application No. 11/780,669, filed on Jul. 20, 2007, now abandoned.

(60) Provisional application No. 60/807,891, filed on Jul. 20, 2006.

(51) Int. Cl.
*G01J 5/00* (2006.01)
*G01J 5/34* (2006.01)
*H01L 31/18* (2006.01)

(52) U.S. Cl.
CPC . *G01J 5/34* (2013.01); *H01L 31/18* (2013.01); *G01J 2005/0077* (2013.01); *G01J 2005/345* (2013.01)

(58) Field of Classification Search
CPC .............................................. B81B 2201/0221
See application file for complete search history.

(56) References Cited

U.S. PATENT DOCUMENTS

| | | | |
|---|---|---|---|
| 5,550,373 A | 8/1996 | Cole et al. | |
| 5,701,008 A | 12/1997 | Ray et al. | |
| 5,811,807 A | 9/1998 | Augeri et al. | |
| 6,118,124 A | 9/2000 | Thundat et al. | |
| 6,278,283 B1 | 8/2001 | Tsugai | |
| 2003/0116711 A1 | 6/2003 | Hara et al. | |
| 2008/0168838 A1* | 7/2008 | Martin et al. | 73/514.32 |

OTHER PUBLICATIONS

Hunter et al., High Sensitivity Uncooled Microcantilever Infrared Imaging Arrays. Proc. of SPIE: Infrared Technology and Applications XXXIII. 2006. vol. 6206: 1-12.

* cited by examiner

*Primary Examiner* — Casey Bryant
(74) *Attorney, Agent, or Firm* — Molly L. Sauter; Smith & Hopen, P.A.

(57) ABSTRACT

An IR imaging system comprising microelectromechanical systems (MEMS) differential capacitive infrared sensors within a sensor array formed on a monolithic integrated circuit substrate, or flip chip bonded onto a signal processing chip fabricated separately, to include, a bimaterial deflectable element anchored to the substrate, a surface electrode fabricated on a top surface of the substrate and positioned below the deflectable element, the surface electrode and the deflectable element separated by a gap to form a first variable capacitor, a sealing ring surrounding the deflectable element and the surface electrode, an infrared transparent sealing cap electrode coupled to the sealing ring to form a vacuum cavity around the deflectable element and the surface electrode, the deflectable element and the sealing cap electrode separated by a gap to form a second variable capacitor and a micro-lens fabricated on the sealing cap electrode to focus the infrared radiation onto the bimaterial deflectable element.

20 Claims, 6 Drawing Sheets

DIFFERENTIAL CAPACITIVE READOUT SYSTEM AND METHOD FOR INFRARED IMAGING

CROSS-REFERENCE TO RELATED APPLICATIONS

This application is a continuation-in-part of currently copending U.S. patent application Ser. No. 11/780,669 filed on Jul. 20, 2007, entitled, "Differential Capacitive Readout System and Method for Infrared Imaging", which claims priority to U.S. Provisional Patent Application No. 60/807,891, filed on Jul. 20, 2006.

STATEMENT OF GOVERNMENT INTEREST

This invention was made with government support under NSF SBIR Grant No. DMI-0441165. The government has certain rights in the invention

FIELD OF INVENTION

This invention relates to infrared imaging systems. More specifically, this invention relates to a differential capacitive readout system and method for an infrared imaging array with wafer level packaged cavity and micro machined on-chip micro-lenses.

BACKGROUND OF THE INVENTION

Infrared (IR) thermal imaging has a number of well-established industrial, commercial, and military applications, such as security, law enforcement surveillance and industrial and environmental monitoring. In recent years, however, there has been increasing interest in medical applications for thermal imaging following the continuing improvements in infrared camera technologies.

Thermal imaging is attractive in the medical setting because it is passive, non-invasive, non-ionizing, patient-friendly, and potentially low-cost. Applications of thermal imaging include mapping of skin temperature change induced by trauma, functional imaging of the brain under varying physiological and psychological conditions, imaging of tissue during laparoscopic surgery, treatment of neural and vascular disorders, and, especially, breast cancer detection. Early detection of breast cancer has a major impact on survival rates, and low-cost, highly sensitive IR imaging systems may help to detect small tumors sooner than traditional X-ray mammography.

The successful use of IR imaging relies on the development of more advanced IR imaging systems. Earlier IR cameras using HgCdTe or InSb electro-optic detectors are expensive, bulky, and inconvenient to use because of the need for cryogenic cooling in order to minimize thermal noise. Quantum well IR detectors also require expensive cryogenic or Stirling engine cooling systems to increase their sensitivity. Many of the existing examples of uncooled IR detectors use resistive or piezoresistive readout, and thereby suffer from higher power consumption and thermal resistive noise. Uncooled pyroelectric and ferroelectric IR detectors require choppers to operate, adding complexity to the camera system. Additionally, uncooled thermoelectric IR detectors have low responsivity.

Accordingly, what is needed in the art is an improved IR imaging system and method.

SUMMARY OF INVENTION

This system in accordance with the present invention provides a novel IR imaging system utilizing microelectromechanical systems (MEMS) and a wafer level packaging scheme, as well as micro machined on-chip micro lenses. The system utilizes a unique differential capacitive readout approach to achieve much higher sensitivity in comparison to traditional capacitive IR sensors known in the art. The system also uses wafer level packaging to create a vacuum cavity around the MEMS sensor elements, so that heat loss due to air conduction can be minimized, thereby further enhancing the system sensitivity. In this way the expensive post-process vacuum packaging can be avoided and the cost of the system can be significantly reduced. In the present invention, micromachining technology is used to fabricate a micro lens array directly onto the capping superstrate that forms the cavity, further improving the sensitivity as more IR energy is focused onto the detector elements. The capping superstrate, made of IR transparent material such as silicon or germanium, is doped to be electrically conductive enough to form the upper electrode of the differential capacitor pair. A traditional bimaterial cantilever or membrane is employed as the moving sensor cell In accordance with the present invention, a differential capacitive infrared sensor is formed on a monolithic integrated circuit substrate. The sensor includes, a bimaterial deflectable element anchored to the substrate, a surface electrode fabricated on a top surface of the substrate and positioned below the deflectable element, the surface electrode and the deflectable element separated by a gap to form a first variable capacitor, a sealing ring surrounding the deflectable element and the surface electrode, an infrared transparent sealing cap electrode coupled to the sealing ring to form a vacuum cavity around the deflectable element and the surface electrode, the deflectable element and the sealing cap electrode separated by a gap to form a second variable capacitor and a micro-lens fabricated on the sealing cap electrode to focus the infrared radiation onto the bimaterial deflectable element.

In a particular embodiment, the bimaterial deflectable element is a cantilever comprising a first material layer overlying a second material layer, wherein the thermal expansion coefficient of the first material layer is greater than the thermal expansion coefficient of the second material layer. In another embodiment, the bimaterial deflectable element is a membrane exhibiting similar properties.

The substrate may be made of silicon, quartz, or other ceramic materials.

The sealing ring and the sealing cap form a vacuum cavity by bonding to the substrate. This bonding may be accomplished through techniques known in the art, including but not limited to, Au—Au thermal compression bonding, eutectic bonding and adhesive bonding using polymer materials. The sealing cap may be fabricated from Si or Ge. In addition, the sealing cap may be doped to become electrically conductive to form the electrode.

The micro-lens that is used to focus the IR radiation onto the deflectable element may be fabricated on the inner surface of the sealing cap electrode or on the outer surface of the sealing cap electrode. In addition the sealing cap electrode may be coated with an anti-reflection coating to minimize IR signal loss due to reflection.

In an additional embodiment, a sensor array may be formed using a plurality of differential capacitive infrared sensors formed on a monolithic integrated circuit substrate, wherein each of the differential capacitive infrared sensors are as previously described and further includes an imaging lens positioned above the sensor array to image a target onto the array by focusing infrared radiation irradiated from a scene.

In accordance with the present invention a method of measuring radiation is provided, including the steps of (1) providing a differential capacitive infrared sensor comprising a bimaterial deflectable element anchored to a monolithic integrated circuit substrate, a surface electrode fabricated on a top surface of the substrate and positioned below the deflectable element, the surface electrode and the deflectable element separated by a gap to form a first variable capacitor, a sealing ring surrounding the deflectable element and the surface electrode, an infrared transparent sealing cap electrode coupled to the sealing ring to form a vacuum cavity around the deflectable element and the surface electrode, the deflectable element and the sealing cap electrode separated by a gap to form a second variable capacitor and a micro-lens fabricated on the sealing cap electrode, (2) exposing the sensor to a source of radiation to cause bending of the bimaterial deflectable element due to differential thermal expansion of the bimaterial resulting in a decrease in the capacitance value of the first variable capacitor and an increase in the capacitance value of the second variable capacitor (3), monitoring a magnitude of the differential between the capacitance value of the first variable capacitor and the second variable capacitor and (4) determining a measure of the radiation from the magnitude of the radiation-induced differential between the capacitance value of the first variable capacitor the second variable capacitor.

A method of fabricating the differential capacitive infrared sensor on a monolithic semiconductor integrated circuit substrate in accordance with the present invention includes (1) forming a bimaterial deflectable element anchored at one end to the monolithic substrate, (2) forming a surface electrode below the bimaterial deflectable element and on a top surface of the substrate, wherein the bimaterial deflectable element is separated from the surface electrode by a gap to form a first variable capacitor (3) forming a transparent sealing cap electrode and (4) bonding the sealing cap electrode in overlying relation to the bimaterial deflectable element and the surface electrode utilizing a sealing ring to form a vacuum cavity around the bimaterial deflectable element and the surface electrode, the sealing cap electrode separated from the bimaterial deflectable element by a gap to form a second variable capacitor.

As such, the present invention provides an improved IR imaging system and method. The present invention will find application in technologies including security screening systems, night vision cameras, firefighting thermal imaging systems, and breast cancer diagnostic systems.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

The present invention provides an un-cooled capacitive MEMS IR detector with differential readout and wafer level packaged cavity and micro-lenses. The system taught herein will solve the problems of the prior designs, while exhibiting very low power consumption and lower noise level, much higher sensitivity, and also making the new IR imaging system smaller, cheaper, and more suitable for practical imaging applications.

Figure 1:
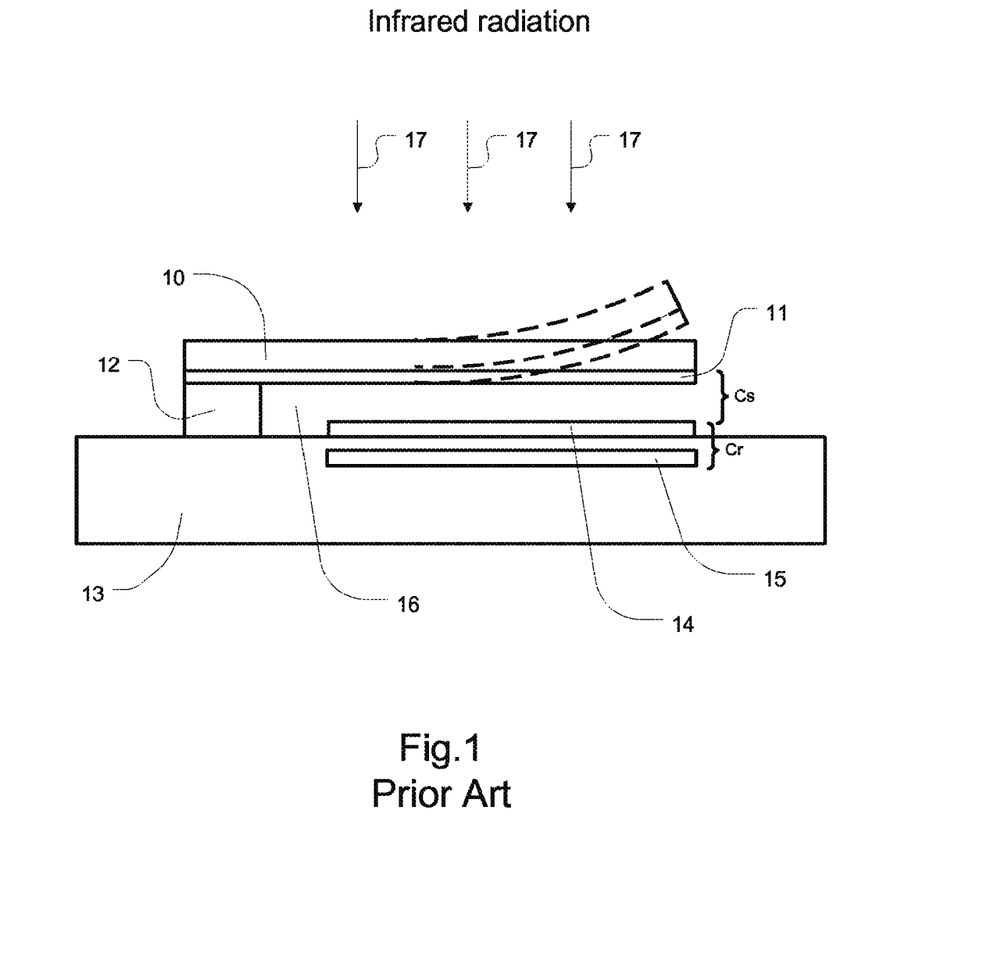
FIG. 1 is an illustration of a prior art MEMS capacitive IR sensor using a biomaterial cantilever.

A prior art capacitive IR sensor is illustrated in FIG. 1. The prior art sensor consists of a bimaterial micro cantilever 10, 11, anchored 12 onto a substrate 13 The substrate can be made of silicon, quartz, or other ceramic materials known in the art. A bottom electrode 14 is made on the top surface of the substrate 13, and another buried electrode 15 is also made under electrode 14, and insulated from it using a dielectric layer. A gap 16 can be created using ordinary MEMS sacrificial layer and release method to allow the MEMS cantilever to move up and down freely. Note that the thermal expansion coefficient of one of the bimaterial 11 must be much larger than the thermal expansion coefficient of the other material 10 of the bimaterial structure, such that under IR radiation 17 and absorption, the temperature of the cantilever will increase and the cantilever will bend up due to the differential thermal expansion of the bimaterial structure, so that the capacitance between the cantilever 10, 11 and the bottom electrode 14 will change. This change of capacitance can create a sensing signal that can be expressed as:

$$V_s = V_b \cdot \frac{(C_s - C_r)}{(C_s + C_r)} \quad (1)$$

where $V_s$ is the voltage sensing signal created by the movement of the cantilever, $V_b$ is the absolute value of bias voltage $+V_b$ is applied to electrode 11 and $-V_b$ is applied to electrode 14, $C_s$ is the sensing capacitance between electrode 11 and 14, $C_r$ is the reference capacitance between electrode 14 and 15. The drawback of this scheme is that only $C_s$ is changing while $C_r$ remains unchanged when the sensing signal is produced.

Figure 2:
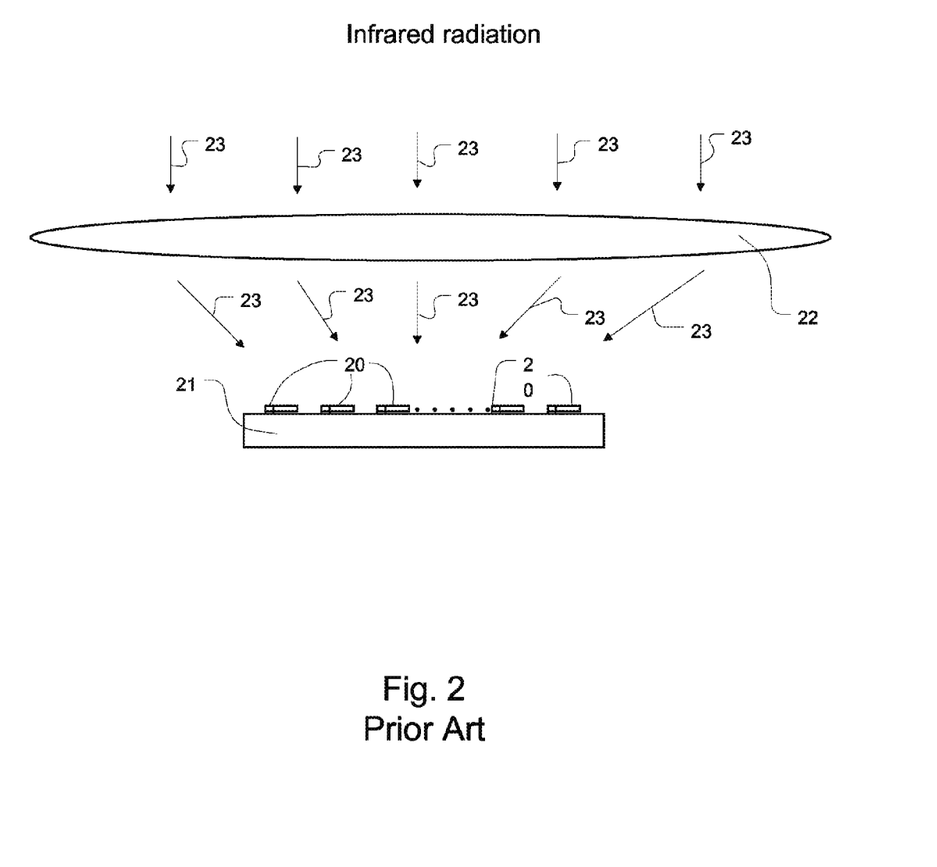
FIG. 2 is an illustration of a prior art cross-sectional view of a focal plane array (FPA) IR imaging array using a 2-D cantilever array.

Thus, efficiency of the prior art device is low. With reference to FIG. 2, a 2-D array of prior art cantilevers can be used as a focal plane array (FPA) to realize IR imaging. FIG. 2 illustrates the cross section of such a 2-D array. The 2-D cantilever array 20 can be made on the top surface of silicon substrate 21. An IR lens 22 is used to focus IR radiation 23 onto the array 20 to realize the imaging.

Figure 3:
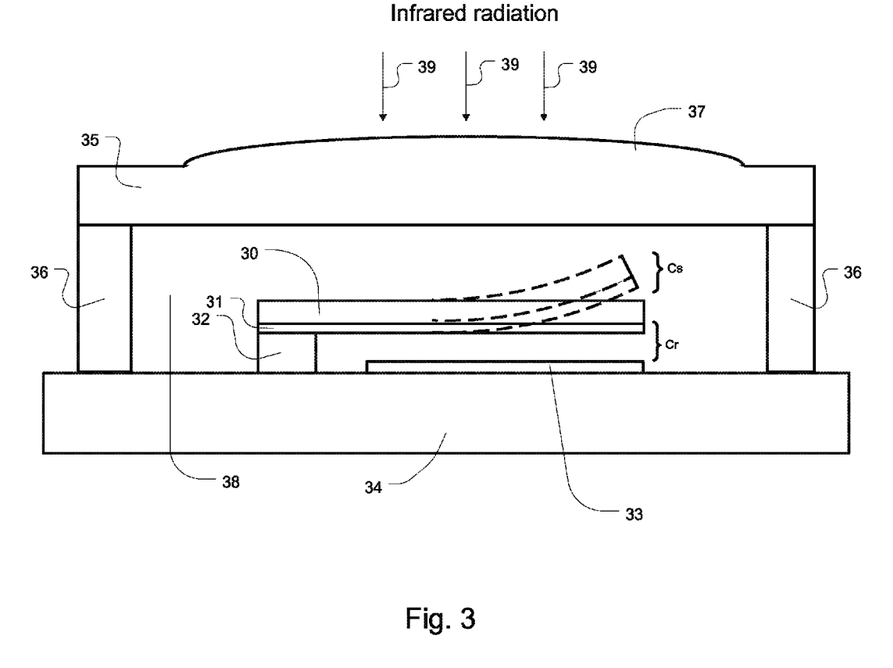
FIG. 3 is an illustration of a differential capacitive IR sensor using a cap as one electrode and micromachined lens on the surface of the cap in accordance with an embodiment of the present invention.

The new sensor structure is illustrated with reference to FIG. 3. In accordance with the present invention, the bimaterial cantilever consists of two materials, 30 and 31. The thermal expansion coefficient of one of the bimaterials 30 (made of metal), must be much larger than the thermal expansion coefficient of the other material 31. The cantilever is anchored 32 to the substrate 34. Another bottom electrode 33 is made on top of the substrate 34, to form one capacitor, $C_r$. A sealing cap 35 is used to form a vacuum cavity 38 through a sealing ring 36 bonded onto the substrate 34. The bonding can be performed using ordinary techniques, such as Au—Au thermal compression bonding, eutectic bonding, and adhesive bonding using polymer materials. The vacuum cavity 38 is very crucial in terms of minimizing heat loss due to air conduction to the surroundings, which would degrade the performance of the IR detector significantly. Also, the cap can be doped to be electrically conductive enough, so that the cap itself will form another capacitor with the sensor electrode 31, CG. The cap 35 needs to be IR transparent, which can be made of Si or Ge, to allow IR radiation 39 to go through and reach the cantilever. Also, a micro-lens 37 is fabricated on the cap 35 using ordinary techniques, such as laser micro-machining or deep reactive ion etching (DRIE). FIG. 3 shows a scheme, wherein the micro-lens 37 is made on the top surface of the cap 35.

Figure 4:
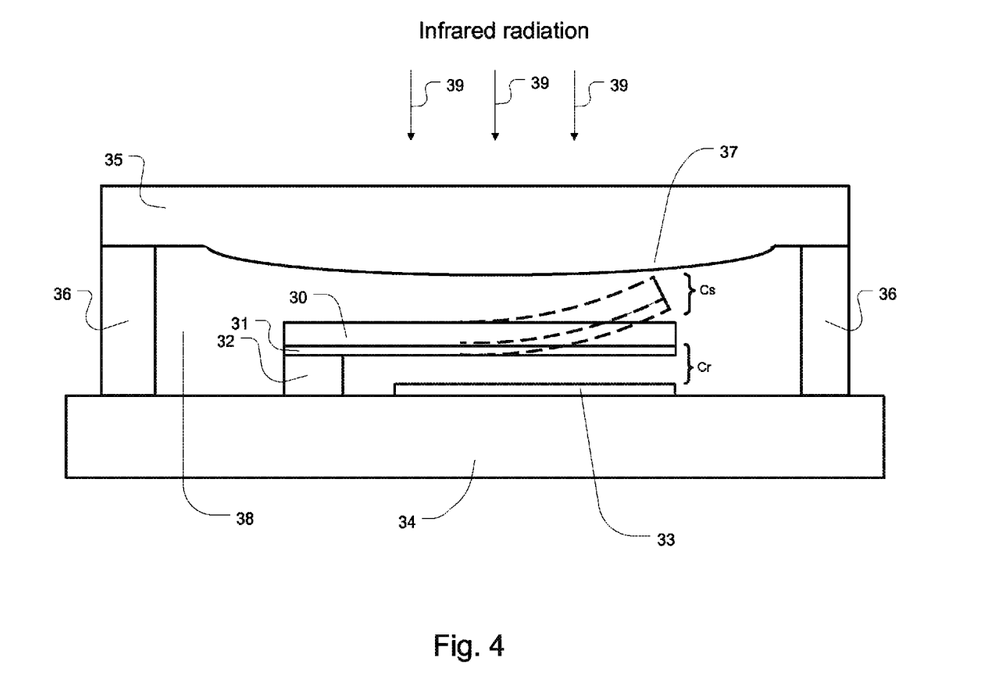
FIG. 4 is an illustration of a differential capacitive IR sensor using a cap as one electrode and micromachined lens on the bottom of the cap in accordance with an embodiment of the present invention.

FIG. 4 shows another approach, wherein the micro-lens 37 is made at the bottom surface of the cap 35. FIG. 4 additionally illustrates the differential capacitance monitor 60 of the present invention. The differential capacitance monitor 60 is physically coupled to the sealing cap electrode 35 through electrode lead 64, to the biomaterial deflectable electrode element 30, 31 through electrode lead 66 and to the surface electrode 33 through electrode lead 62. As such, the differential capacitance monitor 60 is physically connected to the electrodes that form the two capacitances, $C_s$ and $C_r$. The differential capacitance monitor 60 measures the differential change between the two capacitances $C_s$ and $C_r$ to generate the differential readout detection signal.

In operation, the IR signal 39 gets focused through the micro-lens 37 and it is absorbed by certain absorbing material on the cantilever (not shown, ordinary technique). The temperature of the cantilever will increase upon IR absorption, and the cantilever will bend up due to differential thermal expansion between the two materials, 30 and 31. Thus, capacitance $C_s$ will increase and capacitance $C_r$ will decrease, such that the efficiency and the sensitivity of the differential readout measured by the differential capacitance monitor 60 will be doubled compared to the prior art shown in FIG. 1, according to equation (1). For the prior art in FIG. 1, the capacitance of only one capacitor is changing upon IR absorption.

In the prior art of FIG. 1, bias voltage $V_b$ can not be higher than the pull-in voltage of the structure, otherwise the cantilever will collapse and touch the substrate surface due to attractive electrostatic force, so that the sensitivity will be limited according to equation (1). On the other hand, in accordance with the present invention, the bias voltage can be as high as possible, since electrostatic forces will cancel each other due to the opposite signs of the voltages applied onto electrode 33 and 35. Hence, the cantilever will not move either way to create the pull-in effect. In this manner, the sensitivity of the sensor can be improved greatly according to equation (1), since the sensing signal voltage is proportional to bias voltage.

Figure 5:
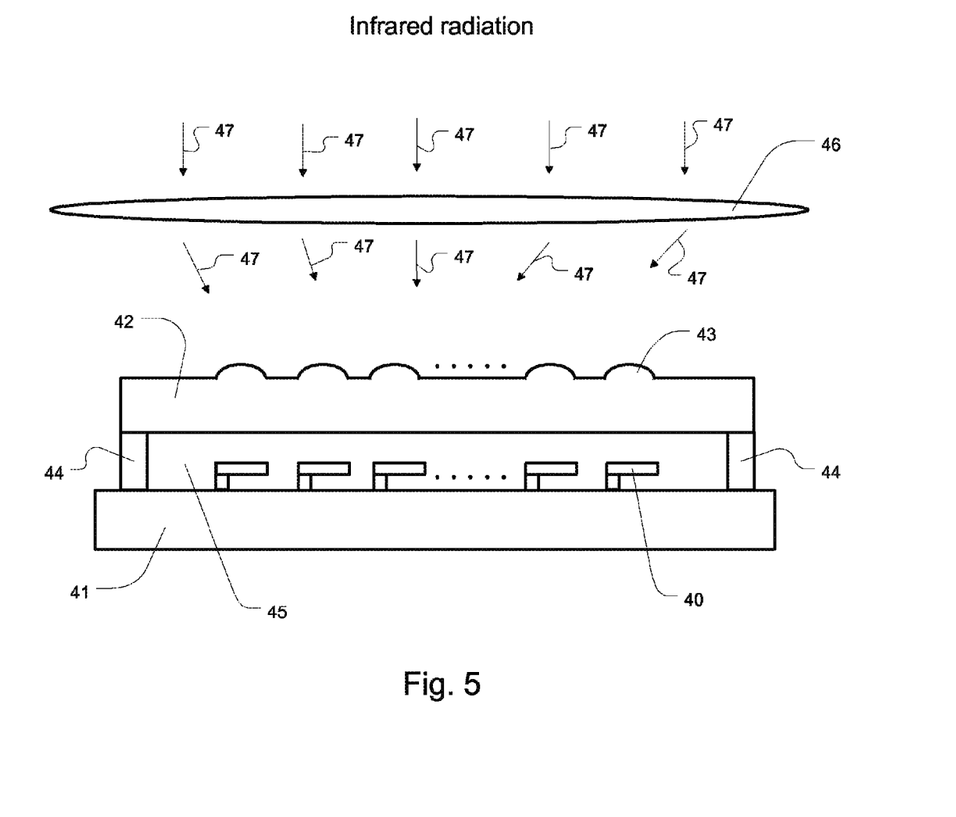
FIG. 5 is an illustration of a cross-section of a focal plane array using a differential capacitive readout microlens array on the top surface of the cap in accordance with an embodiment of the present invention.
Figure 6:
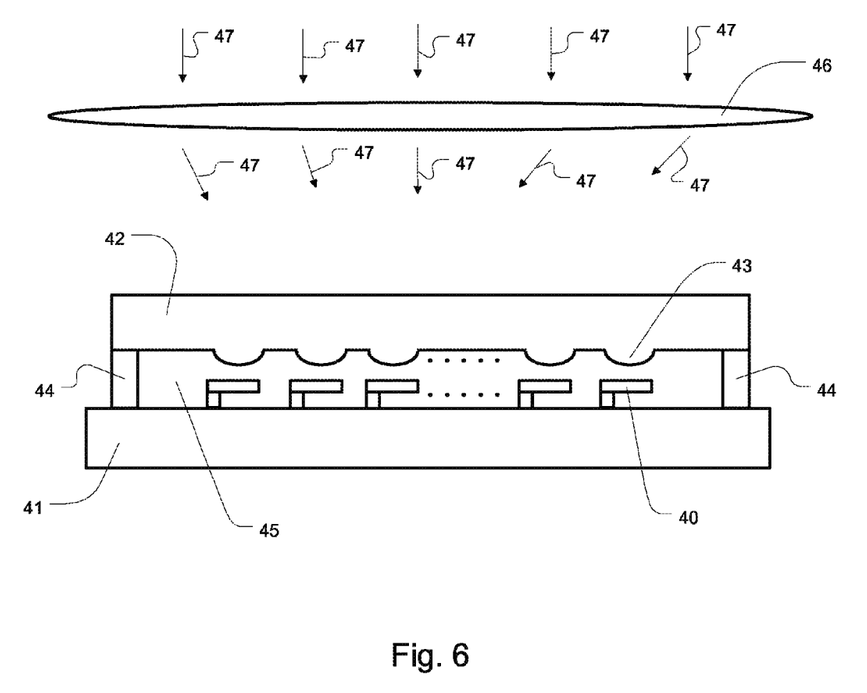
FIG. 6 is an illustration of a cross-section of a focal plane array using a differential capacitive readout microlens array on the bottom surface of the cap in accordance with an embodiment of the present invention.

A 2-D array 40 of sensors in accordance with the present invention can be made on silicon or another substrate 41 as shown in FIG. 5. In this embodiment, a sealing cap 42 with a 2-D micro-lens array 43, will be used to form a vacuum cavity 45, through the sealing ring 44 bonded onto substrate 41. This can be performed using ordinary techniques, such as Au—Au thermal compression bonding, eutectic bonding, or adhesive bonding. FIG. 5 illustrates one embodiment wherein a micro-lens array 43 is made on the top surface of the cap 42, while FIG. 6 illustrates another embodiment wherein the micro-lens array 43 is made at the bottom surface of the cap 42. In this way, the sensitivity can be further improved due to more focused IR energy onto the detector elements by increasing the fill factor greatly. In an additional embodiment, an imaging lens 46 is used to image the target onto the focal plane array by focusing IR radiation 47 irradiated from the scene. The differential capacitance monitor 60 may be coupled to each of the sensors in the array of sensors 40 as previously described with reference to FIG. 4.

The basic sensor element of the present invention is not limited to a cantilever. Any structures using vertical movement based on bimaterial differential thermal expansion, such as cantilevers and membranes, may be used as sensor elements.

In another embodiment, an anti-reflection coating may be deposited on the front and back sides of the cap 42 to minimize IR signal loss due to reflection.

In addition, the micro-lens array may be omitted and the sensitivity of the system will still be greatly improved due to the differential capacitive readout approach described above compared to traditional schemes.

The method is not limited to infrared sensor and sensor array (FPA) integrated with monolithic integrated circuit on the same substrate. Alternatively, infrared sensor/sensor array (FPA), and control circuitry can be fabricated separately on different substrates, and bonded together using common techniques, such as flip chip bonding, wherein the interconnections for each IR sensor pixel can be realized using technique known in the arts, such as through wafer via interconnection.

The disclosure of all publications cited above are expressly incorporated herein by reference, each in its entirety, to the same extent as if each were incorporated by reference individually.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A differential capacitive infrared sensor formed on an integrated circuit substrate, the sensor comprising:
   a bimaterial deflectable electrode element contiguously anchored to a top surface of the integrated circuit substrate;
   a surface electrode fabricated on the top surface of the integrated circuit substrate and positioned below the deflectable electrode element, the surface electrode and the deflectable electrode element separated by a gap to form a first variable capacitor having a first capacitance value;
   a sealing ring surrounding the deflectable electrode element and the surface electrode, the sealing ring including a top surface, a bottom surface and a sidewall having a predetermined height, the bottom surface of the sealing ring wafer bonded to the top surface of the integrated circuit substrate;
   an infrared transparent sealing cap electrode coupled to the top surface of the sealing ring to form a vacuum cavity around the deflectable electrode element and the surface electrode, the sealing cap electrode being transparent to infrared radiation and doped to be electrically conductive and the sealing cap electrode and the deflectable electrode separated by a gap formed, at least in part, by the predetermined height of the sidewall of the sealing ring to form a second variable capacitor having a second capacitance value;

a micro-lens fabricated on the sealing cap electrode to focus the infrared radiation onto the bimaterial deflectable electrode element;

a first bias voltage applied to the surface electrode and a second bias voltage applied to the sealing cap electrode, wherein the first bias voltage is substantially equal in absolute value to the second bias voltage and the first bias voltage is opposite in polarity to the second bias voltage; and a differential capacitance monitor physically coupled to the biomaterial deflectable electrode element, to the surface electrode and to the sealing cap electrode, the differential capacitance monitor to monitor a magnitude of the differential between the first capacitance value of the first variable capacitor and the second capacitance value of the second variable capacitor, wherein the magnitude of the differential between the first capacitance value of the first variable capacitor and the second capacitance value of the second variable capacitor is proportional to the absolute value of the first bias voltage and the second bias voltage.

2. The sensor of claim 1, wherein the bimaterial deflectable electrode element is a cantilever.

3. The sensor of claim 2, wherein the cantilever further comprises a first material layer overlying a second material layer, wherein the thermal expansion coefficient of the first material layer is greater than the thermal expansion coefficient of the second material layer.

4. The sensor of claim 1, wherein the bimaterial deflectable electrode element is a membrane.

5. The sensor of claim 1, wherein the substrate is made of a material selected from the group consisting of silicon, quartz and ceramic materials.

6. The sensor of claim 1, wherein the sealing ring and the sealing cap form a vacuum cavity by bonding to the substrate through a process selected from the group consisting of Au—Au thermal compression bonding, eutectic bonding and adhesive bonding using polymer materials.

7. The sensor of claim 1, wherein the sealing cap is fabricated of a material selected from the group consisting of Si or Ge.

8. The sensor of claim 1, wherein the micro-lens is fabricated on the inner surface of the sealing cap electrode.

9. The sensor of claim 1, wherein the micro-lens is fabricated on the outer surface of the sealing cap electrode.

10. The sensor of claim 1, wherein the sealing cap electrode is coated with an anti-reflection coating.

11. A sensor array comprising:
a plurality of differential capacitive infrared sensors formed on an integrated circuit substrate, each of the plurality of sensors further comprising:
a bimaterial deflectable electrode element contiguously anchored to a top surface of the integrated circuit substrate;
a surface electrode fabricated on the top surface of the integrated circuit substrate and positioned below the deflectable electrode element, the surface electrode and the deflectable electrode element separated by a gap to form a first variable capacitor;
a sealing ring surrounding the deflectable electrode element and the surface electrode, the sealing ring including a top surface, a bottom surface and a sidewall having a predetermined height, the bottom surface of the sealing ring wafer bonded to the top surface of the integrated circuit substrate;
an infrared transparent sealing cap electrode coupled to the top surface of the sealing ring to form a vacuum cavity around the deflectable electrode element and the surface electrode, the sealing cap electrode being transparent to infrared radiation and doped to be electrically conductive and the sealing cap electrode and the deflectable electrode separated by a gap formed, at least in part, by the predetermined height of the sidewall of the sealing ring to form a second variable capacitor, and
a micro-lens fabricated on the sealing cap electrode to focus the infrared radiation onto the bimaterial deflectable electrode element;
an imaging lens positioned above the sensor array to image a target onto the array by focusing infrared radiation irradiated from a scene;
a first bias voltage applied to the surface electrode and a second bias voltage applied to the sealing cap electrode, wherein the first bias voltage is substantially equal in absolute value to the second bias voltage and the first bias voltage is opposite in polarity to the second bias voltage; and
a plurality of differential capacitance monitors, each one of the plurality of differential capacitance monitors physically coupled to the biomaterial deflectable electrode element, to the surface electrode and to the sealing cap electrode of each of the plurality of sensors, the differential capacitance monitor to monitor a magnitude of the differential between the first capacitance value of the first variable capacitor and the second capacitance value of the second variable capacitor of each one of the plurality of sensors, wherein the magnitude of the differential between the first capacitance value of the first variable capacitor and the second capacitance value of the second variable capacitor is proportional to the absolute value of the first bias voltage and the second bias voltage.

12. The sensor array of claim 11, wherein the bimaterial deflectable electrode element is a cantilever.

13. The sensor array of claim 11, wherein the bimaterial deflectable electrode element is a membrane.

14. A method of measuring radiation, the method comprising:
providing a differential capacitive infrared sensor comprising a bimaterial deflectable electrode element contiguously anchored to a top surface of an integrated circuit substrate, a surface electrode fabricated on the top surface of the integrated circuit substrate and positioned below the deflectable electrode element, the deflectable electrode element separated by a gap to form a first variable capacitor, a sealing ring surrounding the deflectable electrode element and the surface electrode, the sealing ring including a top surface, a bottom surface and a sidewall having a predetermined height, the bottom surface of the sealing ring wafer bonded to the top surface of the integrated circuit substrate, an infrared transparent sealing cap electrode coupled to the top surface of the sealing ring to form a vacuum cavity around the deflectable electrode element and the sealing cap electrode being transparent to infrared radiation and doped to be electrically conductive, the deflectable electrode element and the sealing cap electrode separated by a gap formed, at least in part, by the predetermined height of the sidewall of the sealing ring to form a second variable capacitor and a micro-lens fabricated on the sealing cap electrode;

applying a first bias voltage to the surface electrode and applying a second bias voltage to the sealing cap electrode, wherein the first bias voltage is substantially equal in absolute value to the second bias voltage and the first bias voltage is opposite in polarity to the second bias voltage;

exposing the sensor to a source of radiation to cause bending of the bimaterial deflectable electrode element due to differential thermal expansion of the bimaterial resulting in a decrease in the capacitance value of the first variable capacitor and an increase in the capacitance value of the second variable capacitor;

monitoring a magnitude of the differential between the capacitance value of the first variable capacitor and the second variable capacitor using a differential capacitance monitor physically coupled to the biomaterial deflectable electrode element, to the surface electrode and to the sealing cap electrode; and determining a measure of the radiation from the magnitude of the radiation-induced differential between the capacitance values of the first variable capacitor the second variable capacitor, wherein the magnitude of the radiation-induced differential between the capacitance values of the first variable capacitor and the second capacitance value is proportional to the absolute value of the first bias voltage and the second bias voltage.

15. The method of claim 14, wherein the step of providing a differential capacitive infrared sensor on a substrate further comprises, providing a plurality of capacitive infrared sensors on a substrate, each of the plurality of sensor comprising a bimaterial deflectable electrode element anchored to the integrated circuit substrate, a surface electrode fabricated on a top surface of the integrated circuit substrate and positioned below the deflectable electrode element, the surface electrode and the deflectable electrode element separated by a gap to form a first variable capacitor, a sealing ring surrounding the deflectable electrode element and the surface electrode, the sealing ring including a top surface, a bottom surface and a sidewall having a predetermined height, the bottom surface of the scaling ring wafer bonded to the integrated circuit substrate, an infrared transparent sealing cap electrode coupled to the top surface of the sealing ring to form a vacuum cavity around the deflectable electrode element and the surface electrode, the sealing cap electrode being transparent to infrared radiation and doped to be electrically conductive and the deflectable electrode element and the sealing cap electrode separated by a gap formed, at least in part, by the predetermined height of the sidewall of the sealing ring to form a second variable capacitor and a micro-lens fabricated on the sealing cap electrode.

16. A method of fabricating a differential capacitive infrared sensor on a semiconductor integrated circuit substrate, the method comprising:

forming a bimaterial deflectable electrode element contiguously anchored at one end to a top surface of the monolithic integrated circuit substrate;

forming a surface electrode below the bimaterial deflectable electrode element and on the top surface of the integrated circuit substrate, wherein the bimaterial deflectable electrode element is separated from the surface electrode by a gap to form a first variable capacitor;

forming an infrared transparent sealing cap electrode, the infrared transparent sealing cap electrode being transparent to infrared radiation and doped to be electrically conductive;

bonding the sealing cap electrode in overlying relation to the bimaterial deflectable electrode element and the surface electrode utilizing a sealing ring, the sealing ring having a top surface coupled to the sealing cap electrode, a sidewall having a predetermined height and a bottom surface wafer bonded to the integrated circuit substrate to form a vacuum cavity around the bimaterial deflectable electrode element and the surface electrode, the sealing cap electrode separated from the bimaterial deflectable electrode element by a gap formed, at least in part, by the predetermined height of the sidewall of the sealing ring to form a second variable capacitor, applying a first bias voltage to the surface electrode and applying a second bias voltage to the sealing cap electrode, wherein the first bias voltage is substantially equal in absolute value to the second bias voltage and the first bias voltage is opposite in polarity to the second bias voltage; and physically coupling a differential capacitance monitor to the biomaterial deflectable electrode element, to the surface electrode and to the sealing cap electrode, the differential capacitance monitor to monitor a magnitude of the differential between the first capacitance value of the first variable capacitor and the second capacitance value of the second variable capacitor, wherein the magnitude of the radiation-induced differential between the capacitance values of the first variable capacitor and the second capacitance value is proportional to the absolute value of the first bias voltage and the second bias voltage.

17. The method of claim 16, wherein the step of forming the infrared transparent sealing cap electrode further comprises fabricating a micro-lens on the sealing cap electrode.

18. The method of claim 16, wherein the step of forming the infrared transparent sealing cap electrode further comprises coating the sealing cap electrode with an anti-reflection material.

19. The method of claim 16, wherein the bimaterial deflective electrode element is a cantilever anchored to the substrate.

20. The method of claim 16, wherein the bimaterial deflective electrode element is a membrane anchored to the substrate.

* * * * *

UNITED STATES PATENT AND TRADEMARK OFFICE
CERTIFICATE OF CORRECTION

| | | |
|---|---|---|
| PATENT NO. | : 9,291,507 B1 | Page 1 of 1 |
| APPLICATION NO. | : 14/231052 | |
| DATED | : March 22, 2016 | |
| INVENTOR(S) | : Weidong Wang et al. | |

It is certified that error appears in the above-identified patent and that said Letters Patent is hereby corrected as shown below:

In the Claims

Column 7, Claim 1, Line 16 should read:

the bimaterial deflectable electrode element, to the sur-

Column 8, Claim 11, Line 29 should read:

cally coupled to the bimaterial deflectable electrode

Column 9, Claim 14, Line 19 should read:

tance monitor physically coupled to the bimaterial

Column 9, Claim 15, Line 43 should read:

the sealing ring wafer bonded to the integrated circuit sub-

Column 10, Claim 16, Line 32 should read:

the bimaterial deflectable electrode element, to the sur-

Signed and Sealed this
Seventh Day of June, 2016

Michelle K. Lee
*Director of the United States Patent and Trademark Office*